United States Patent

Tsuchimoto

[15] 3,635,767

[45] Jan. 18, 1972

[54] METHOD OF IMPLANTING IMPURITY IONS INTO THE SURFACE OF A SEMICONDUCTOR

[72] Inventor: Takashi Tsuchimoto, Kodaira-shi, Japan

[73] Assignee: Hitachi, Ltd., Tokyo, Japan

[22] Filed: Sept. 24, 1969

[21] Appl. No.: 860,583

[30] Foreign Application Priority Data

Sept. 30, 1968 Japan....................................43/70129

[52] U.S. Cl....................................148/1.5, 29/576, 148/187

[51] Int. Cl..........................................................H01l 7/54

[58] Field of Search..............................29/576; 148/1.5, 187

[56] References Cited

UNITED STATES PATENTS

| | | | |
|---|---|---|---|
| 3,341,754 | 9/1967 | Kellett et al. | 148/1.5 |
| 3,431,150 | 3/1969 | Dolan, Jr. et al. | 148/1.5 |
| 3,481,030 | 12/1969 | Velde et al. | 148/1.5 |
| 3,523,042 | 8/1970 | Bower et al. | 148/1.5 |

*Primary Examiner*—L. Dewayne Rutledge
*Assistant Examiner*—J. Davis
*Attorney*—Craig, Antonelli and Hill

[57] ABSTRACT

Disclosed is a method of implanting impurity ions wherein such ions are implanted into the surface of a semiconductor partially exposed by a hole in two layers, one being made of silicon oxide and the other being made of a metal such as aluminum.

7 Claims, 20 Drawing Figures

INVENTOR

TAKASHI TSUCHIMOTO

BY Craig, Antonelli, Stewart & Hill

ATTORNEYS

INVENTOR

TAKASHI TSUCHIMOTO

BY Craig, Antonelli, Stewart & Hill

ATTORNEYS

METHOD OF IMPLANTING IMPURITY IONS INTO THE SURFACE OF A SEMICONDUCTOR

BACKGROUND OF THE INVENTION

1. Field of the Invention

This invention relates to a method of implanting impurity ions into the surface of a semiconductor substrate and more particularly to a method of implanting impurity ions partially into the surface without degeneration the electrical characteristics of a passivation film of the semiconductor substrate.

2. Description of the Prior Art

An ion implantation method is known as a method of forming a PN-junction by partially adding an active impurity like phosphorus, boron, etc. to a semiconductor substrate. In this method, the active impurity to be added is ionized, accelerated by an accelerator and made bombard the semiconductor substrate. Thus, ions are physically implanted into the semiconductor substrate. This method has the following advantages. Firstly, the impurity concentration and impurity distribution in the surface layer of a semiconductor substrate may be freely controlled by adjusting the energy of the active impurity ions to be implanted. The long thermal treatment required in forming a PN- junction by a conventional thermal diffusion method is unnecessary and an active impurity may be implanted at a relatively low temperature. Further, an impurity layer of a thickness less than 1 $\mu$ which has been difficult to form by said thermal diffusion method may be easily formed and the impurity may be injected with a good reproducibility by making the ion energy uniform.

Now, there will be explained with reference to FIG. 1 a method of forming an impurity ion implanted layer having an arbitrary shape by partially implanting impurity ions into a semiconductor substrate. An insulating film 2 which has a sufficient thickness to stop the ion beam, e.g., a $SiO_2$ film, is deposited on the surface of a semiconductor substrate 1 and a hole 3 is formed at a predetermined part of the $SiO_2$ film by use of photoetching techniques to expose the said part of the semiconductor surface. Then, the surface of the semiconductor substrate provided with the $SiO_2$ film is bombarded with a beam 4 of the desired active impurity ions. Thus, ions are implanted only into the part of the semiconductor substrate surface exposed by the said hole and an ion implanted layer 5 having a shape controlled by the $SiO_2$ film is formed. If the conductivity type of the active impurity ion is opposite to that of the substrate, a PN-junction is formed at the interface between the ion implanted layer and the substrate.

In particular, in order to form a transistor element by the said method, a new $SiO_2$ film 6 (in FIG. 2) is deposited on the element shown in FIG. 1 by the known method and a hole 7 for forming an emitter region 8 is made in the $SiO_2$ film 6. Then, it is bombarded by a beam 9 of active impurity ions giving the same conductivity type with that of the substrate to form an ion-implanted layer 8 in the semiconductor substrate exposed by the hole 7 in the $SiO_2$ film.

In the semiconductor substrate formed in this way, the substrate 1 becomes a collector region of a transistor, the first ion implanted layer becomes a base region and the second ion implanted region becomes an emitter region.

In order to form a transistor element a new $SiO_2$ film 9 (in FIG. 3) is deposited, and holes for emitter, base and collector electrodes are formed in the insulating films by photoetching techniques and then electrode metals are deposited to contact with the respective regions.

This method however, has the following disadvantages. (1) Since a large amount of active impurity ions are included in the semiconductor passivation film, a degeneration of the electrical characteristics of the semiconductor device is caused thereby during operation. Namely, undesired charges are induced on the semiconductor substrate surface due to the effect of the ions implanted into the passivation film and thus the rectifying characteristic of the PN-junction formed on the substrate surface is degenerated and the electrical characteristic changes with time. (2) When electrode holes are formed in the passivation film, the etching speed of each film for etchant, e.g., fluoric acid, differs because each film of a double or triple passivation film layer includes different kinds of ions. Therefore, in the case of that electrode holes are formed at the emitter and base parts by photoetching, holes are not made simultaneously due to the difference in etching speed because such disadvantages as side etching based on the difference in etching speed may occur.

Particularly, when a transistor is small and accuracy of less than 1 $\mu$m. is required, the process is quite difficult.

In order to avoid such disadvantages, a new oxide film not bombarded with an ion beam may be deposited after the oxide bombard with ions is completely removed. In this case, however, since the ion implanted region formed by ion beam bombardment cannot be distinguished from no bombarded region by an optical microscope, positioning is not achieved.

SUMMARY OF THE INVENTION

An object of this invention is to provide an improved method of implanting ions into the surface of a semiconductor substrate without implanting active impurity ions into the passivation film.

Another object of the invention is to provide a method of making a semiconductor device having stable electrical characteristics by the ion implantation method.

A further object of the invention is to provide an improved method of ion implanting, wherein positioning for implantation is easily done when ions are to be implanted into a semiconductor substrate.

In order to achieve the said objects, the ion implantation method according to this invention comprises the following steps. In order to form an ion implanted layer of active impurity ions on the predetermined surface of a semiconductor, an insulating film such as a $SiO_2$ film is deposited on the surface of the semiconductor substrate and a metal layer for preventing ion implantation is deposited on the said insulating film to form a double layer consisting of the insulating film and the metal film. Then, a hole is provided at the predetermined part of the double layer by photoetching technique to expose the predetermined surface of the semiconductor. A beam of active impurity ions bombards onto the surface of the semiconductor substrate surface where the double layer is provided and an ion implanted region is formed only in the exposed semiconductor substrate surface.

In this case, ions are not implanted into the semiconductor substrate surface covered with the double layer due to the effect of the metal layer which prevents ion implantation.

The thickness of the insulating film on the semiconductor substrate surface may be such that is sufficient to stabilize the electrical characteristics of the semiconductor device. In the case of a $SiO_2$ film, it is about 3,000–8,000 A. Further, as a passivation film, silicon nitride, alumina, phospho-silicate glass, boron-silicate glass, alumino-silicate glass, alumino-phospho-silicate glass and alumino-boron-silicate glass or both layer thereof are used in general.

The thickness of the metal layer on the insulating layer must be such that is sufficient to prevent an ion beam from penetrating therethrough and reaching the insulating film. Further, the metal layer for stopping the ion beam must be easily deformed, easily evaporated and effective for preventing ion bombardment. At present, A1, Mo, Ta, Cr, Ni, etc. are considered to be suitable.

The transistor according to this invention can be formed by repeating the process described hereinabove.

DESCRIPTION OF THE PREFERRED EMBODIMENTS

Embodiment 1

Figure 1:
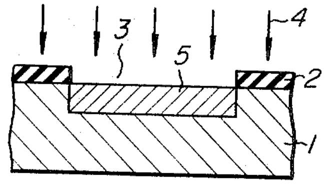
FIG. 1 PRIOR ART
FIGS. 1 to 3 are longitudinal sectional views for explaining the process of fabricating a transistor by the known ion implantation method.
Figure 2:
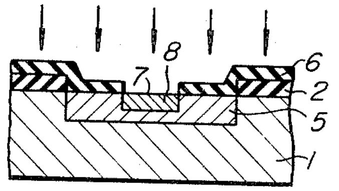
FIG. 2 PRIOR ART
Figure 3:
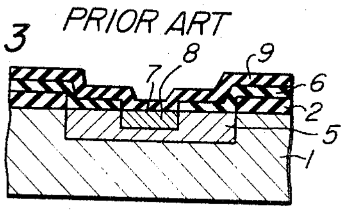
FIG. 3 PRIOR ART

FIGS. 4 to 7 show embodiments of this invention, wherein a diode structure is formed by the method of this invention. Usually, many diodes are formed simultaneously on a single semiconductor wafer, but only one diode is shown and the main part is expanded in the drawings for convenience of explanation.

Figure 4:
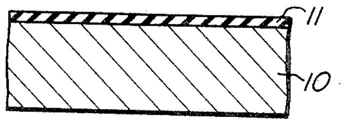
FIGS. 4 to 7 show embodiments of this invention and they are longitudinal sectional view explaining the process of fabricating a diode by the ion implantation method.
Figure 5:
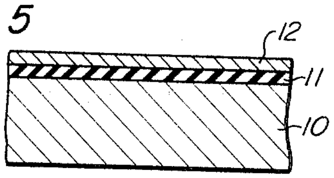
Figure 6:
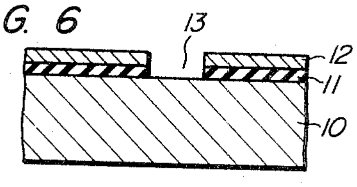
Figure 7:
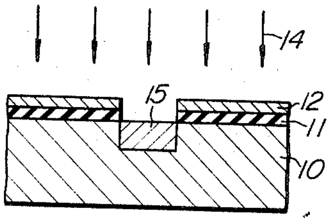

In FIG. 4, 10 denotes a silicon single crystal substrate of 10 Ω-cm. in resistivity and a $SiO_2$ film of 4,000 A. in thickness is deposited on one surface thereof. The $SiO_2$ film is formed by known methods such as high-temperature oxidation method, thermal decomposition of organo-oxysilane, or the sputtering method, etc. Then, chromium 12 is deposited on the $SiO_2$ film 11 in the vacuum deposition device. The thickness of the chromium 12 is sufficient if it prevents ions from penetrating therethrough under ion bombardment.

Then, a hole 13 is provided in the double layer on the surface of the semiconductor substrate by applying a photoresist film on the chromium layer, exposing and printing desired parts by ultraviolet light and eliminating the unexposed photoresist film by a cleanser (e.g., trichrolethylene). Then, in order to eliminate the predetermined portion of chromium layer, the semiconductor substrate is immersed into a mixed solution of sodium hydroxide and potassium ferricyanide. Further, the semiconductor substrate is immersed into a mixed solution of fluoric acid and nitric acid to eliminate the $SiO_2$ film exposed by the elimination of the chromium layer.

A hole 13 is formed in the double layer by the process described above and the substrate surface is exposed.

Then, the semiconductor substrate is mounted in an ion bombardment device (not shown, see for example U.S. Pat. specification No. 3,341,754) and bombarded with a boron ion beam 14 to form an ion implanted region 15 in the exposed surface of the semiconductor substrate. The ion implanted region 15 has a P-conductivity type.

Then, after completely eliminating the chromium layer on the insulating film 11, electrodes are set to the ion-implanted region 15 and the substrate to study the current-voltage characteristic. The rectifying characteristic having an inverse withstand voltage of about 30 v. was observed.

In this embodiment, ions bombarding the chromium layer stop in the chromium layer and do not reach the $SiO_2$ film.

Figure 8:
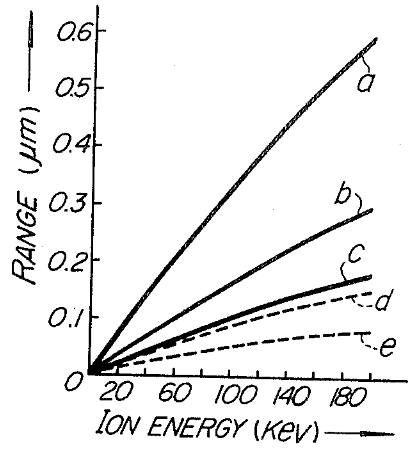
FIG. 8 shows the experimental result of the range of ions implanted into the metal film.
Figure 9:
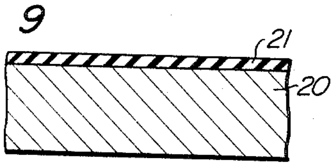
FIG. 9 to 20 show other embodiments of this invention and are longitudinal sectional views explaining the process of fabricating a transistor by the ion implantation method.
Figure 10:
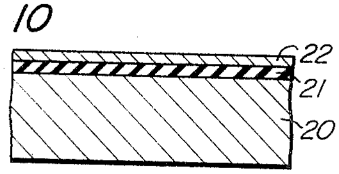
Figure 11:
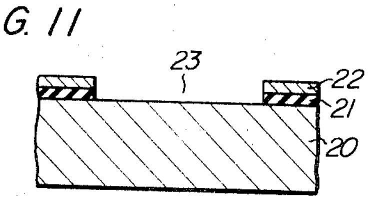
Figure 12:
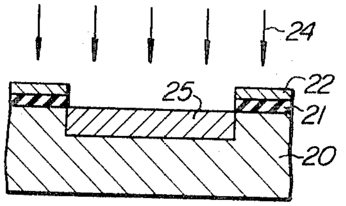
Figure 13:
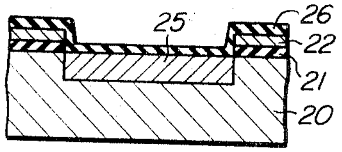

FIG. 8 shows the range of boron and phosphorus ions with respect to the metal film in ion implantation. The solid curves *a*, *b*, *c*, show the range of boron in aluminum, chromium and molybdenum when boron is bombarding and the dotted curves *d*, *e* show the range of phosphorus in aluminum and chromium when a phosphorus ion beam is bombarding.

The thickness of the metal layer on the insulating film 11 can be calculated from these experimental results.

Embodiment 2

FIGS. 9 to 20 show the process of forming a transistor on a semiconductor substrate surface by the method of this invention.

Numeral 20 denotes an N-conductivity-type silicon single crystal substrate and a first insulating film, e.g., a $SiO_2$ film 21, is formed on one principal surface thereof by known methods. Further, a first metal layer, e.g., a chromium layer 22, is formed on the $SiO_2$ film 21 by vacuum evaporation. Then, a first hole 23 is provided at a predetermined part of the double layer consisting of the $SiO_2$ film 21 and the chromium layer 22 to expose a part of the semiconductor substrate surface. The exposed surface is bombarded with a beam of first impurity ions, e.g., a boron ion beam 24, to form a first ion-implanted region 25. This first ion-implanted region has a P-conductivity type. The boron ion is stopped by the chromium layer and does not reach to the first insulating layer of $SiO_2$ 21.

Figure 14:
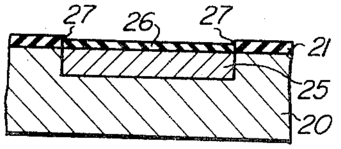
Figure 15:
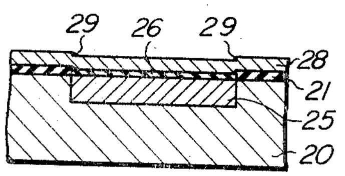
Figure 16:
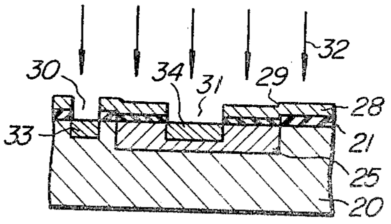
Figure 17:
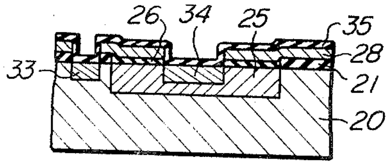

After the desired ion implanted region is formed, a second insulating film, e.g., a SiO film 26, is deposited on the whole surface and the first-metal layer 22 is melted. In this case, not only the metal layer 22, but also the second-insulating film 26 deposited thereon is eliminated. If the thickness of the first insulating film and the second insulating film is made different, a step 27 as shown in FIG. 14 is formed after the first metal layer is eliminated. This step is used as a standard of shape recognition of the ion-implanted region 25. Then, a second metal layer, e.g., a chromium layer 28, is deposited on the silicon substrate surface covered with the remaining first and second-insulating films 21, 26. In this case, the step 27 appears in the form of a step 29 of the chromium layer 28. Holes 30, 31 are then provided in the double layer consisting of the insulating film and the metal layer by known photoetching techniques and after the surface of the silicon substrate is exposed, a second impurity ion beam, e.g., a phosphorus ion beam 32 is made to bombard to form second ion-implanted regions 33, 34. The second ion implanted regions have $N^+$-conductivity type.

Figure 18:
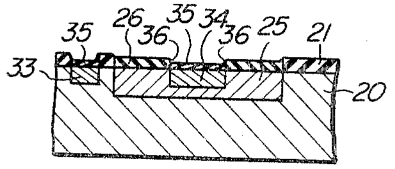
Figure 19:
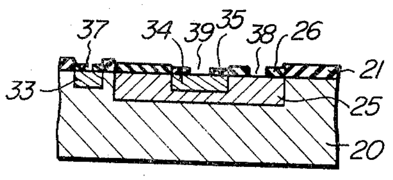
Figure 20:
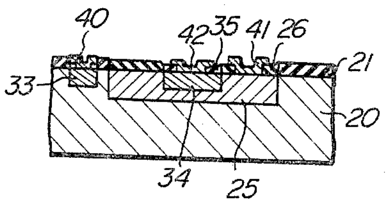

In the second ion-implanted regions, 34 acts as an emitter region of a transistor and 33 acts as a region for deriving an electrode of a collector region. After the regions 33, 34 are formed, a third-insulating film 35, e.g., a $SiO_2$ film, is deposited. Then, the second metal layer is eliminated to form a surface passivated transistor element as shown in FIG. 18.

In order to derive electrodes from the regions of such an element, holes 37, 38 and 39 are provided in the first, second and third insulating films by photoetching and the silicon substrate surface is exposed. Then, after evaporating electrode metal like aluminum on the whole surface, collector, base and emitter electrodes 40, 41, 42 are formed by photoetching techniques.

An NPN-type silicon transistor is fabricated by the process described hereinabove.

Since steps are formed at the position of the insulating film corresponding to the boundaries of the collector, the base and the emitter in the embodiment described hereinabove, ion implanted regions are easily recognized and precision processing becomes possible.

I claim:

1. A method of implanting impurity ions into the surface of a semiconductor substrate comprising the steps of;
   a. forming a first insulating layer on the surface of the semiconductor substrate,
   b. depositing a first metal layer on the first insulating layer to form the two layers consisting of the first insulating layer and first metal layer,
   c. forming a first hole in the two layers to expose a first predetermined surface portion of the semiconductor substrate,
   d. bombarding a first impurity ions in the surface of the semiconductor substrate covered and exposed partially by the two layers to form a first ion implanted region in the first predetermined surface portion of the semiconductor substrate,
   e. depositing an insulating layer on the first metal layer and the exposed surface of the substrate,
   f. removing the first metal layer and the second insulating layer on the metal layer,
   g. depositing the second metal layer on the surface of the first and second insulating layer,
   h. forming a second hole in the two layers of the second metal layer and the second insulating layer to expose the predetermined surface portion of the first ion implanted region,
   i. bombarding a second impurity ions on the surface covered and exposed partially by the two layers, thereby forming a second ion implanted region in the first ion implanted region.

2. A method according to claim 1, wherein said first and second insulating layer are selected from the group consisting of silicon oxide, aluminum oxide and silicon nitride.

3. A method according to claim 1, wherein said first and second metal layer are selected from the group consisting of aluminum, molybdenum, tantalum and chromium.

4. A method according to claim 3, wherein the thickness of said first and second metal layers are enough to prevent the impurity ions from passing therethrough.

5. A method according to claim 1, wherein the conductivity type of the first ion implanted region is opposite to that of the semiconductor substrate.

6. A method according to claim 1, wherein the conductivity type of the second ion implanted region is opposite to that of the first ion implanted region and same to that of the semiconductor substrate.

7. A method according to claim 1, wherein the thickness of said first insulating layer is different from that of said second insulating layer.

* * * * *